(12) United States Patent
Azuma (10) Patent No.: US 12,507,367 B2
(45) Date of Patent: Dec. 23, 2025

(54) POWER CONVERTER (71) Applicant: FUJI ELECTRIC CO., LTD., Kawasaki (JP)

(72) Inventor: Toshiaki Azuma, Amagasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 280 days.

(21) Appl. No.: 18/297,790

(22) Filed: Apr. 10, 2023

(65) Prior Publication Data

US 2023/0345658 A1 Oct. 26, 2023

(30) Foreign Application Priority Data

Apr. 25, 2022 (JP) ................................. 2022-071927

(51) Int. Cl.
*H05K 7/14* (2006.01)
*B60L 15/00* (2006.01)
*H05K 7/06* (2006.01)

(52) U.S. Cl.
CPC ........ *H05K 7/14322* (2022.08); *B60L 15/007* (2013.01); *H05K 7/06* (2013.01); *H05K 7/14339* (2022.08)

(58) Field of Classification Search
None
See application file for complete search history.

(56) References Cited

U.S. PATENT DOCUMENTS

| | | | |
|---|---|---|---|
| 6,313,598 B1* | 11/2001 | Tamba | H01L 23/4334 361/728 |
| 6,326,761 B1* | 12/2001 | Tareilus | H02M 7/003 318/722 |
| 7,207,187 B2 | 4/2007 | Funahashi et al. | |
| 7,635,046 B2* | 12/2009 | Tominaga | H02K 11/33 361/720 |
| 8,519,561 B2 | 8/2013 | Azuma et al. | |
| 9,042,147 B2 | 5/2015 | Ishii et al. | |
| 10,524,375 B2* | 12/2019 | Kogure | H05K 1/144 |

(Continued)

FOREIGN PATENT DOCUMENTS

| | | |
|---|---|---|
| JP | 2009-159767 A | 7/2009 |
| JP | 2014-113051 A | 6/2014 |

(Continued)

OTHER PUBLICATIONS

Japan Patent Office, "Office Action for Japanese Patent Application 2022-071927," May 24, 2022.

(Continued)

*Primary Examiner* — Krystal Robinson
(74) *Attorney, Agent, or Firm* — HAUPTMAN HAM, LLP (57) ABSTRACT

A power converter includes a semiconductor module, a capacitor module, a control board, and an insulating plate. The capacitor module includes a smoothing capacitor, a first connection terminal electrically connected to the smoothing capacitor and a power supply outside the power converter, and a second connection terminal electrically connected to the semiconductor module. The insulating plate is located between the capacitor module and the control board so as to cover at least one of the first connection terminal and the second connection terminal.

11 Claims, 9 Drawing Sheets

(56) References Cited

U.S. PATENT DOCUMENTS

| | | | | |
|---|---|---|---|---|
| 11,744,052 | B2* | 8/2023 | Müller | H05K 7/20872 |
| | | | | 361/699 |
| 2003/0200761 | A1* | 10/2003 | Funahashi | F04C 29/0085 |
| | | | | 62/228.4 |
| 2009/0002974 | A1* | 1/2009 | Yahata | H02M 7/003 |
| | | | | 361/820 |
| 2009/0257211 | A1* | 10/2009 | Kontani | H02M 7/003 |
| | | | | 361/782 |
| 2011/0116235 | A1* | 5/2011 | Ryu | B60L 58/10 |
| | | | | 361/699 |
| 2019/0075673 | A1 | 3/2019 | Kogure | |
| 2019/0098777 | A1* | 3/2019 | Nakatsu | H02M 7/003 |
| 2021/0021203 | A1 | 1/2021 | Kojima et al. | |

FOREIGN PATENT DOCUMENTS

| | | | |
|---|---|---|---|
| JP | 2018-085792 | A | 5/2018 |
| JP | 2019-198229 | A | 11/2019 |
| JP | 6740622 | B2 | 7/2020 |
| WO | 2019193903 | A1 | 10/2019 |

OTHER PUBLICATIONS

Indian Patent Office, Examination Report for Indian Patent Application No. 202314026728 mailed Sep. 22, 2025; 10 pp.

\* cited by examiner

POWER CONVERTER

CROSS-REFERENCE TO RELATED APPLICATION

The present application claims priority of Japanese Patent Application No. 2022-071927 filed Apr. 25, 2022, the disclosure of which is hereby incorporated by reference.

BACKGROUND OF THE INVENTION

Field of the Invention

The present invention relates to a power converter, and more particularly, it relates to a power converter including a semiconductor module that performs power conversion and a control board that controls the power conversion of the semiconductor module.

Description of the Background Art

A power converter including a semiconductor module that performs power conversion and a control board that controls the power conversion of the semiconductor module is known in general. Such a power converter is disclosed in Japanese Patent Laid-Open No. 2019-198229, for example.

Japanese Patent Laid-Open No. 2019-198229 discloses a power converter including a semiconductor module that performs power conversion, a control board that controls the power conversion of the semiconductor module, and a housing that houses the semiconductor module and the control board.

Although not clearly described in Japanese Patent Laid-Open No. 2019-198229, a conventional power converter as described in Japanese Patent Laid-Open No. 2019-198229 may include a capacitor module including a smoothing capacitor that smooths power supplied from a power supply outside the power converter, and house the capacitor module together with a semiconductor module and a control board in a housing. In such a case, it is necessary to space a terminal of the capacitor module and the control board apart from each other in the housing in order to prevent a short circuit between the terminal of the capacitor module and the control board.

However, when the terminal of the capacitor module and the control board are spaced apart from each other as described above, it is necessary to space the terminal of the capacitor module and the control board apart from each other by an air insulation distance (an insulation distance in a case in which insulation is performed by air) in order to prevent a short circuit between the terminal of the capacitor module and the control board. Thus, the size of the housing that houses the control board and the capacitor module is increased. Consequently, the size of the power converter is disadvantageously increased.

SUMMARY OF THE INVENTION

The present invention has been proposed in order to solve the aforementioned problems, and an object of the present invention is to provide a power converter capable of reducing or preventing an increase in its size due to an increase in the side of a housing.

In order to attain the aforementioned object, a power converter according to an aspect of the present invention includes a semiconductor module to perform power conversion; a capacitor module including a smoothing capacitor, a first connection terminal electrically connected to the smoothing capacitor and a power supply outside the power converter, and a second connection terminal electrically connected to the semiconductor module; a control board to control the power conversion of the semiconductor module; a housing to house the semiconductor module, the capacitor module, and the control board; and a plate-shaped insulating plate located between the capacitor module and the control board so as to cover at least one of the first connection terminal and the second connection terminal and made of an insulating resin.

In the power converter according to this aspect, as described above, the plate-shaped insulating plate made of an insulating resin is located between the capacitor module and the control board so as to cover a least one of the first connection terminal and the second connection terminal. Accordingly, when the insulating plate is located between the capacitor module and the control board so as to cover the first connection terminal, a distance between the first connection terminal of the capacitor module and the control board can be reduced as compared with a case in which the first connection terminal of the capacitor module and the control board are air-insulated (insulated by air) from each other. Consequently, an increase in the size of the housing can be reduced or prevented, and thus an increase in the size of the power converter due to an increase in the size of the housing can be reduced or prevented. Furthermore, when the insulating plate is located between the capacitor module and the control board so as to cover the second connection terminal, a distance between the second connection terminal of the capacitor module and the control board can be reduced as compared with a case in which the second connection terminal of the capacitor module and the control board are air-insulated from each other. Consequently, an increase in the size of the housing can be reduced or prevented, and thus an increase in the size of the power converter due to an increase in the size of the housing can be reduced or prevented.

In the power converter according to this aspect, the control board is preferably arranged above the semiconductor module and the capacitor module, and the insulating plate is preferably located between the first and second connection terminals and the control board so as to cover the first and second connection terminals. Accordingly, the insulating plate is located between the first and second connection terminals and the control board so as to cover the first and second connection terminals, and thus a distance between the first and second connection terminals and the control board can be reduced as compared with a case in which the first and second connection terminals and the control board are air-insulated from each other. Consequently, an increase in the size of the housing can be reduced or prevented, and thus an increase in the size of the power converter due to an increase in the size of the housing can be reduced or prevented.

In the power converter according to this aspect, the control board is preferably fixed to the housing via the insulating plate without being directly fixed to the housing. When the control board is fixed to both the housing and the insulating plate, it becomes difficult to fix the control board due to the dimensional tolerance of each of the housing and the insulating plate. With the configuration described above, the control board is fixed to the housing via the insulating plate, and thus it is only required to fix the control board according to the dimensional tolerance of the insulating plate. Consequently, the control board can be easily fixed to the insulating plate.

In the power converter according to this aspect, the housing is preferably made of metal, and the insulating plate is preferably located between the first connection terminal of the capacitor module and the housing so as to cover the first connection terminal. Accordingly, the insulating plate is located between the first connection terminal of the capacitor module and the housing so as to cover the first connection terminal, and thus even when the housing is deformed to be dented inward due to an external impact or the like, contact of the housing made of metal with the first connection terminal of the capacitor module can be prevented. Consequently, when the housing made of metal is deformed to be dented inward due to an external impact or the like, a short circuit between the first connection terminal of the capacitor module and the deformed housing can be prevented.

In this case, the housing preferably includes a side wall surrounding the capacitor module, the first connection terminal is preferably provided at a position facing the side wall, and the insulating plate preferably includes a wall extending along the side wall between the side wall of the housing and the first connection terminal. Accordingly, the wall extends along the side wall of the housing between the side wall of the housing and the first connection terminal, and thus even when the housing is deformed to be dented inward due to an external impact or the like, contact of the housing made of metal with the first connection terminal of the capacitor module can be prevented. Consequently, when the housing made of metal is deformed to be dented inward due to an external impact or the like, a short circuit between the first connection terminal of the capacitor module and the deformed housing can be easily prevented.

In the power converter according to this aspect, the housing preferably includes a plurality of fastening holes to fasten and fix the insulating plate, the capacitor module preferably further includes a capacitor case to house the smoothing capacitor, the capacitor case preferably includes a recess recessed inward toward the smoothing capacitor, and at least one of the plurality of fastening holes is preferably provided at a position corresponding to the recess of the capacitor case. Accordingly, at least one of the plurality of fastening holes is provided at the position corresponding to the recess recessed inward toward the smoothing capacitor, and thus a space provided by the recess can be effectively used to provide the fastening hole. Consequently, an increase in the size of the housing in a direction in which the recess of the capacitor case is recessed can be reduced or prevented, and thus an increase in the size of the power converter due to an increase in the size of the housing can be reduced or prevented.

In the power converter according to this aspect, the semiconductor module preferably includes a control terminal connected to the control board, the insulating plate preferably includes an opening extending along the control board and provided so as to correspond to the control terminal, and the control terminal is preferably connected to the control board via the opening. Accordingly, as compared with a case in which wiring is provided to connect the control terminal of the semiconductor module to the control board so as to bypass the insulating plate arranged between the semiconductor module and the control board, connection paths can be further shortened. Consequently, the control terminal of the semiconductor module can be easily connected to the control board, and thus the complexity of the device configuration can be reduced or prevented.

The power converter according to this aspect preferably further includes a plurality of conductor wirings electrically connected to a load outside the power converter, the semiconductor module preferably includes a plurality of connectors provided so as to correspond to the plurality of conductor wirings to connect the plurality of conductor wirings to the semiconductor module, and the insulating plate is preferably located between the plurality of connectors and the control board so as to cover the plurality of connectors. Accordingly, the insulating plate is located between the plurality of connectors and the control board so as to cover the plurality of connectors, and thus a distance between the plurality of connectors and the control board can be reduced as compared with a case in which the plurality of connectors and the control board are air-insulated from each other. Consequently, an increase in the size of the housing can be reduced or prevented, and thus an increase in the size of the power converter due to an increase in the size of the housing can be reduced or prevented.

In the configuration in which the semiconductor module includes the plurality of connectors, the control board is preferably fastened and fixed to the insulating plate between the plurality of connectors in a direction along the control board. Accordingly, unlike a case in which the control board is fastened and fixed to the insulating plate at a position overlapping one of the plurality of connectors, interference of a member such as a screw for fastening and fixing the control board with the connector can be reduced or prevented. Consequently, as compared with a case in which the control board is fastened and fixed to the insulating plate at the position overlapping one of the plurality connectors, a portion at which the control board is fastened can be positioned closer to the semiconductor module. Thus, the size of the insulating plate in a direction in which the insulating plate faces the semiconductor module can be reduced, and thus an increase in the size of the housing can be reduced or prevented. Consequently, an increase in the size of the power converter due to an increase in the size of the housing can be reduced or prevented.

In the configuration in which the semiconductor module includes the plurality of connectors, the insulating plate preferably includes a concave interference avoidance portion provided so as to correspond to each of the plurality of connectors and recessed to avoid interference with the plurality of connectors. Accordingly, interference of the insulating plate with the plurality of connectors can be avoided by the concave interference avoidance portions, and thus the insulating plate can be positioned closer to the semiconductor module including the plurality of connectors. Consequently, the size of the housing in the direction in which the semiconductor module and the insulating plate face each other can be further reduced. Thus, an increase in the size of the housing can be further reduced or prevented, and thus an increase in the size of the power converter due to an increase in the size of the housing can be further reduced or prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is hereinafter described with reference to the drawings.

The configuration of a power converter 100 according to this embodiment is now described with reference to FIGS. 1 to 10.

Configuration of Power Converter

The power converter 100 is an inverter that is attached to a motor 200, converts power supplied from a battery 300 outside the power converter, and supplies (outputs) the converted power to the motor 200 outside the power converter. The motor 200 is a motor for a vehicle such as an electric vehicle or a hybrid vehicle, for example. That is, the power converter 100 is a vehicle inverter (power converter). The motor 200 outside the power converter is an example of a "load outside the power converter" in the claims, and the battery 300 outside the power converter is an example of a "power supply outside the power converter" in the claims.

Figure 1:
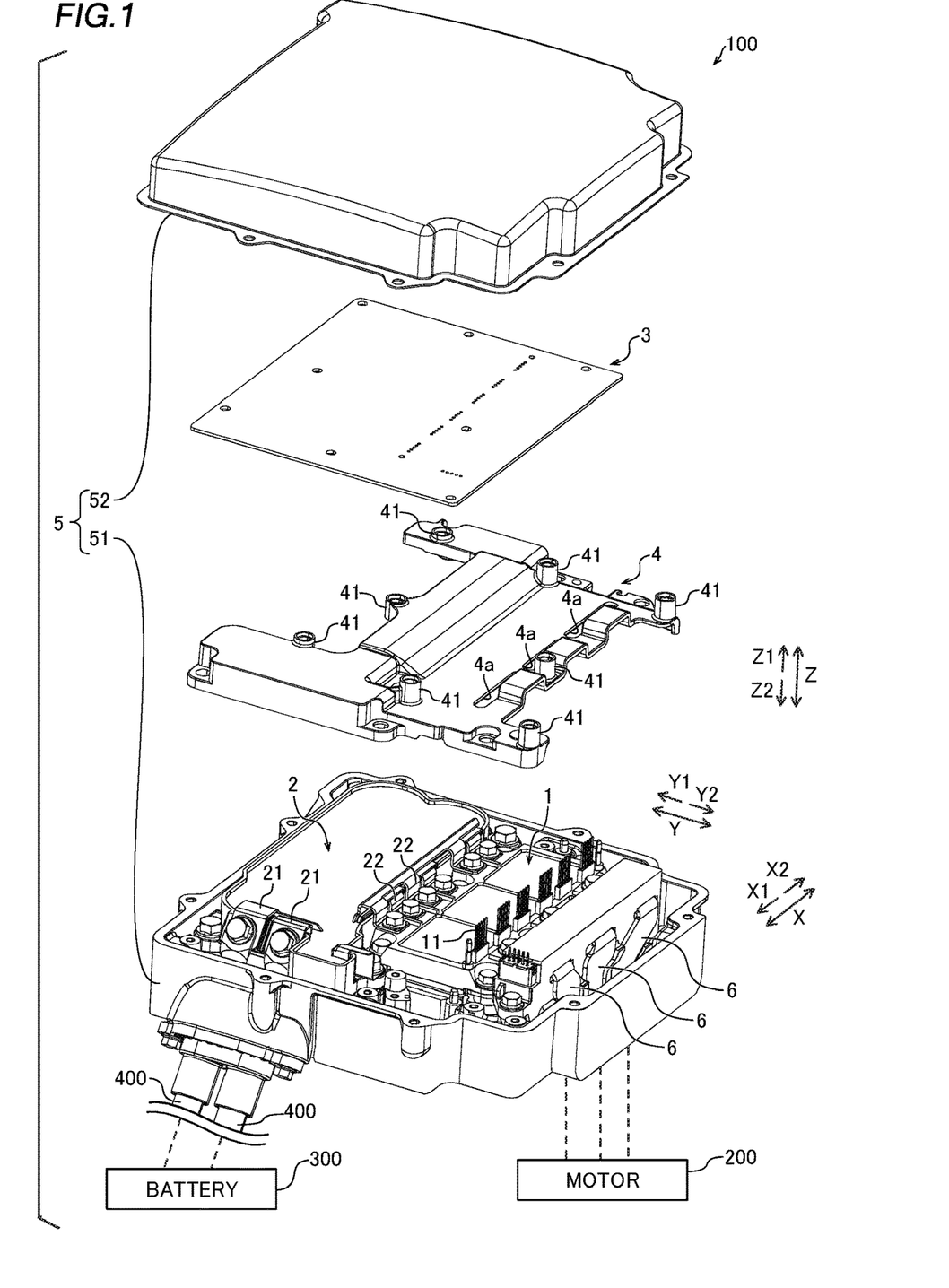
FIG. 1 is an exploded perspective view illustrating the configuration of a power converter according to an embodiment of the present invention.
Figure 2:
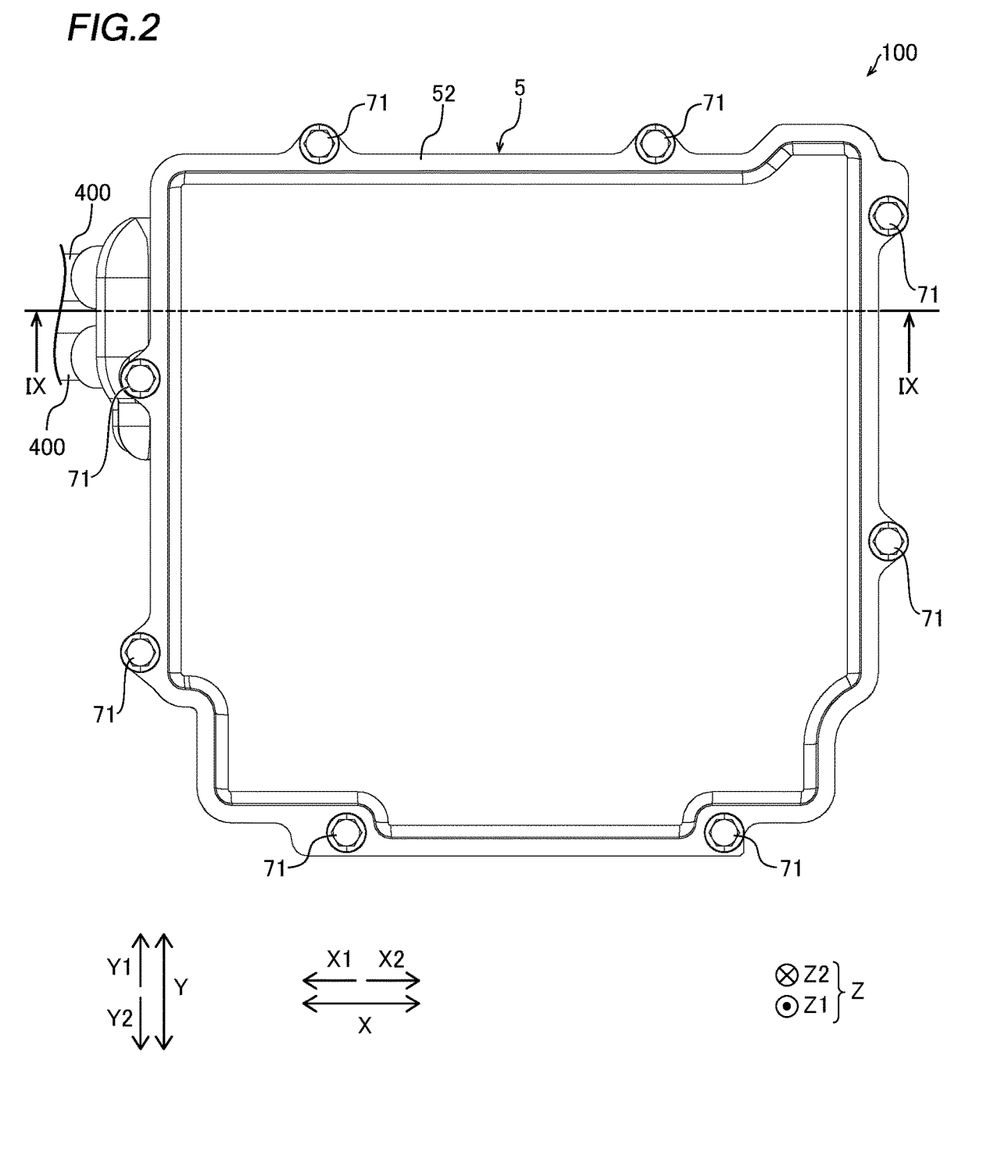
FIG. 2 is a diagram showing a housing of the power converter according to the embodiment of the present invention, as viewed from above (Z1 direction side)

As shown in FIG. 1, the power converter 100 includes a semiconductor module 1 that performs power conversion, a capacitor module 2, a control board 3, a fixing plate 4, and a housing 5. The fixing plate 4 is an example of an "insulating plate" in the claims. In this description, one direction in a plane on which the control board 3 extends is defined as an X direction (an X1 direction and an X2 direction), a direction perpendicular to the X direction in the plane is defined as a Y direction (a Y1 direction and a Y2 direction), and a direction perpendicular to a surface of the control board 3 is defined as a Z direction (a Z1 direction and a Z2 direction).

The power converter 100 also includes a plurality of conductor wirings 6 electrically connected to the motor 200 outside the power converter. The conductor wirings 6 are plate-shaped metal wirings. The conductor wirings 6 are copper bars, for example. A plurality of (three) conductor wirings 6 is provided so as to correspond to phases (a U-phase, a V-phase, and a W-phase) of AC power supplied to the motor 200 outside the power converter.

The semiconductor module 1 includes a plurality of switching elements. Specifically, the semiconductor module 1 is an IGBT module including a plurality of insulated gate bipolar transistors (IGBTs). The semiconductor module 1 also includes control terminals 11 connected to the control board 3.

The capacitor module 2 is a module that smooths power (DC power) supplied from the battery 300 outside the power converter 100. The capacitor module 2 includes smoothing capacitors C (see FIG. 6) described below, and the smoothing capacitors C smooth the power (DC power) supplied from the battery 300 outside the power converter 100.

The capacitor module 2 also includes connection terminals 21 electrically connected to the smoothing capacitors C and the battery 300 outside the power converter. The capacitor module 2 also includes connection terminals 22 electrically connected to the semiconductor module 1. The connection terminals 22 are provided on the side (Y2 direction side) of the capacitor module 2 on which the semiconductor module 1 is arranged. The connection terminals 21 are provided on one side (X1 direction side) in the X direction intersecting the Y direction in which the semiconductor module 1 and the capacitor module 2 are adjacent to each other. The connection terminals 21 are examples of a "first connection terminal" in the claims, and the connection terminals 22 are examples of a "second connection terminal" in the claims.

Power lines 400 that supply power from the battery 300 to the capacitor module 2 and the semiconductor module 1 are introduced into the housing 5. The power lines 400 are connected to the connection terminals 21.

The control board 3 controls the power conversion of the semiconductor module 1. Specifically, the control board 3 controls switching of the switching elements in the semiconductor module 1 via the control terminals 11. The control board 3 is a printed circuit board (PCB) on which a wiring pattern is formed by conductors and electronic components are mounted. Electronic components such as a transformer, a capacitor, and a connector (not shown) are mounted on the control board 3.

The fixing plate 4 is a plate-shaped member arranged between the capacitor module 2 and the control board 3 and made of an insulating resin. The fixing plate 4 is a member made of a polyphenylene sulfide (PPS) resin, for example. The fixing plate 4 extends along the control board 3 (the surface of the control board 3). The fixing plate 4 may be made of an insulating resin other than a PPS resin. For example, the fixing plate 4 may be made of an insulating resin such as a polybutylene terephthalate (PBT) resin.

As shown in FIG. 1, the fixing plate 4 includes a plurality of bosses 41 to which screws 72 (see FIG. 3) described below are fastened in order to fasten and fix the control board 3. Holes are provided in the bosses 41 to fasten and fix the screws 72 described below. The bosses 41 extend along the Z direction. In this embodiment, eight bosses 41 are provided.

The housing 5 houses the semiconductor module 1, the capacitor module 2, and the control board 3. Furthermore, the housing 5 houses the fixing plate 4 and the conductor wirings 6. The housing 5 is attached to the motor 200. In this embodiment, as shown in FIG. 1, the capacitor module 2, the semiconductor module 1, and the conductor wirings 6 are arranged in this order from the Y1 direction side in the housing 5.

As shown in FIG. 1, the housing 5 includes a main body 51 and a cover 52 attached to the main body 51. The main body 51 is a metal member containing aluminum. The cover 52 is a metal member containing iron. That is, the housing 5 is made of metal and has electrical conductivity. The cover 52 is fastened and fixed to the main body 51 with a plurality of (eight) screws 71 (see FIG. 2).

Figure 3:
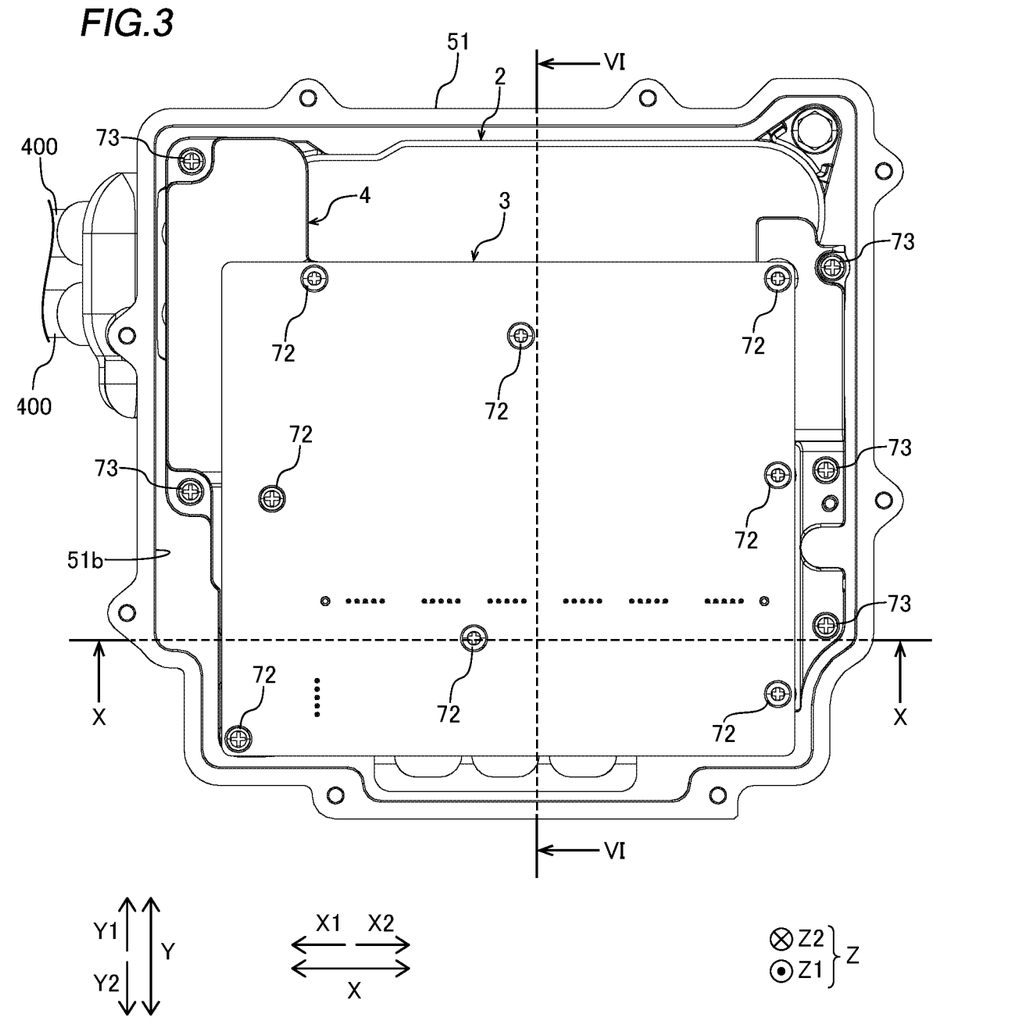
FIG. 3 is a diagram showing the power converter from which a cover has been removed from the state in FIG. 2, as viewed from above (Z1 direction side)

In this embodiment, as shown in FIG. 3, the control board 3 is fastened and fixed to the fixing plate 4 with a plurality of (eight) screws 72. Specifically, an outer edge of the control board 3 is fastened and fixed with a plurality of (six) screws 72. Furthermore, a central portion of the control board 3 in the X direction is fastened and fixed with a plurality of (two) screws 72. Thus, damage of the control board 3 due to flexural deformation of the central portion of the control board 3 can be prevented. In the power converter 100 according to this embodiment, at least one of the plurality of screws 72 is electrically connected to fastening holes 51a (described below) of the main body 51 via the bosses 41 (see FIG. 4) such that the control board 3 is grounded.

Figure 4:
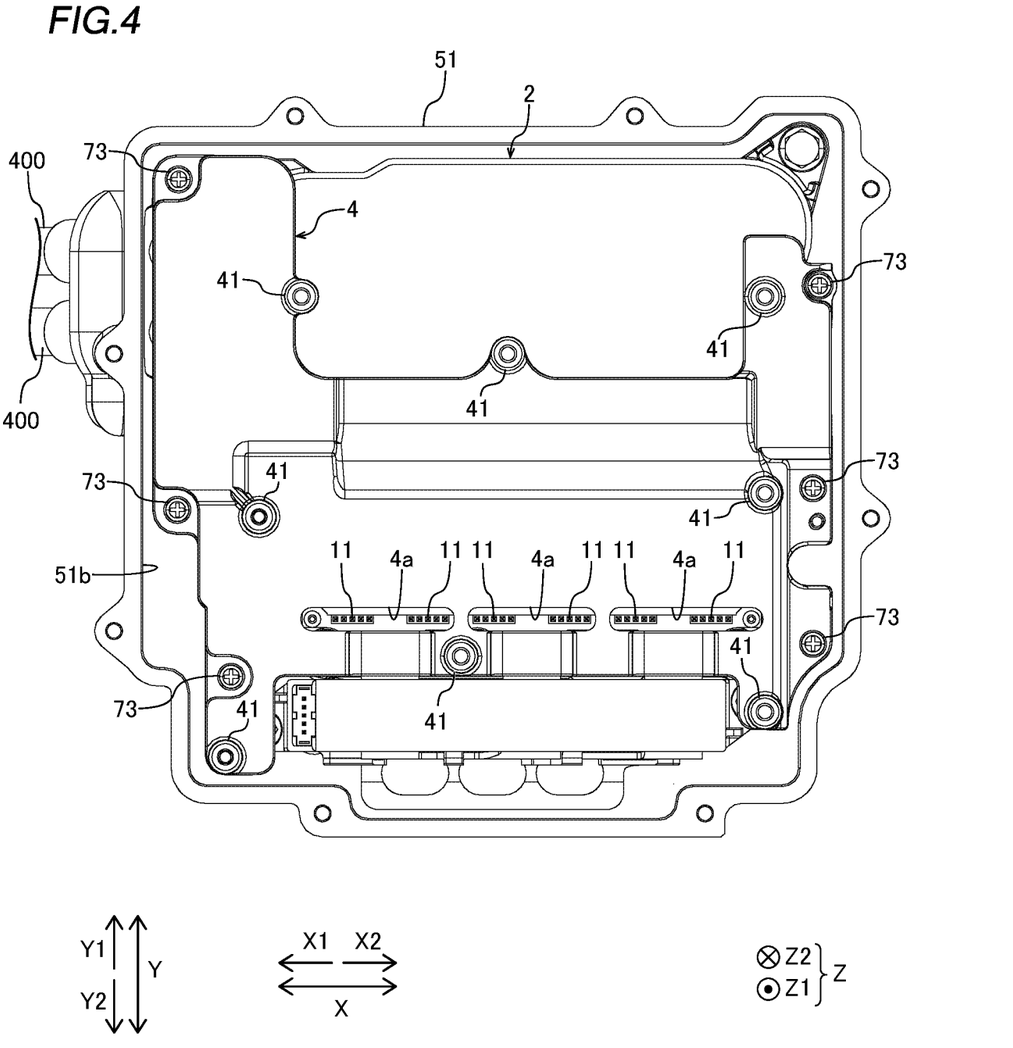
FIG. 4 is a diagram showing the power converter from which a control board has been removed from the state in FIG. 3, as viewed from above (Z1 direction side)

As shown in FIG. 4, the fixing plate 4 has a substantially H-shape as viewed from the Z1 direction side. The fixing plate 4 is fastened and fixed to the main body 51 with a plurality of (six) screws 73. Some (two) of the plurality of (six) screws 73 are fastened to the main body 51 outside (X1 direction side) the boss 41 arranged on the most X1 direction side among the plurality of (eight) bosses 41 of the fixing plate 4. Furthermore, some (three) of the plurality of (six) screws 73 are fastened to the main body 51 outside (X2 direction side) the boss 41 arranged on the most X2 direction side among the plurality of (eight) bosses 41 of the fixing plate 4. Moreover, some (two) of the plurality of (six) screws 73 are fastened to the main body 51 outside (Y1 direction side) the boss 41 arranged on the most Y1 direction side among the plurality of (eight) bosses 41 of the fixing plate 4.

As shown in FIG. 4, the fixing plate 4 includes openings 4a provided so as to correspond to the control terminals 11. The control terminals 11 are connected to the control board 3 (see FIG. 3) via the openings 4a.

Figure 5:
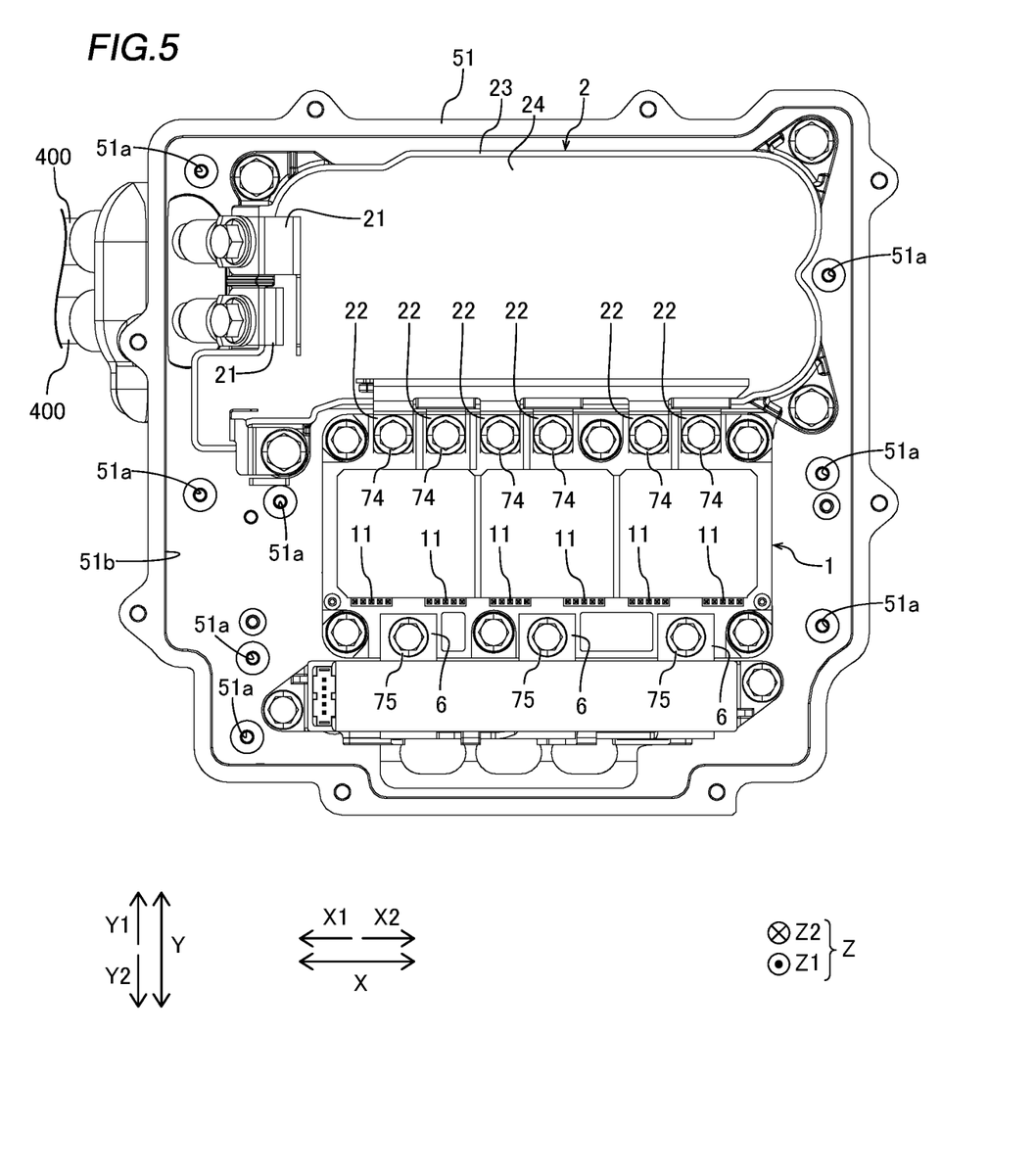
FIG. 5 is a diagram showing the power converter from which a fixing plate has been removed from the state in FIG. 4, as viewed from above (Z1 direction side)

As shown in FIG. 5, a plurality of (two) connection terminals 21 is provided so as to correspond to phases (a P-phase and an N-phase) of DC power supplied from the battery 300. Furthermore, three connection terminals 22 are provided for one connection terminal 21 so as to correspond to the phases (the U-phase, the V-phase, and the W-phase) of the AC power supplied to the motor 200. That is, six connection terminals 22 are provided.

As shown in FIG. 5, the main body 51 of the housing 5 includes a plurality of fastening holes 51a for fastening and fixing the fixing plate 4. In this embodiment, eight fastening holes 51a are provided. The fixing plate 4 is fastened and fixed to the main body 51 of the housing 5 using the screws 73 (see FIG. 4) and the fastening holes 51a provided in the main body 51.

Figure 6:
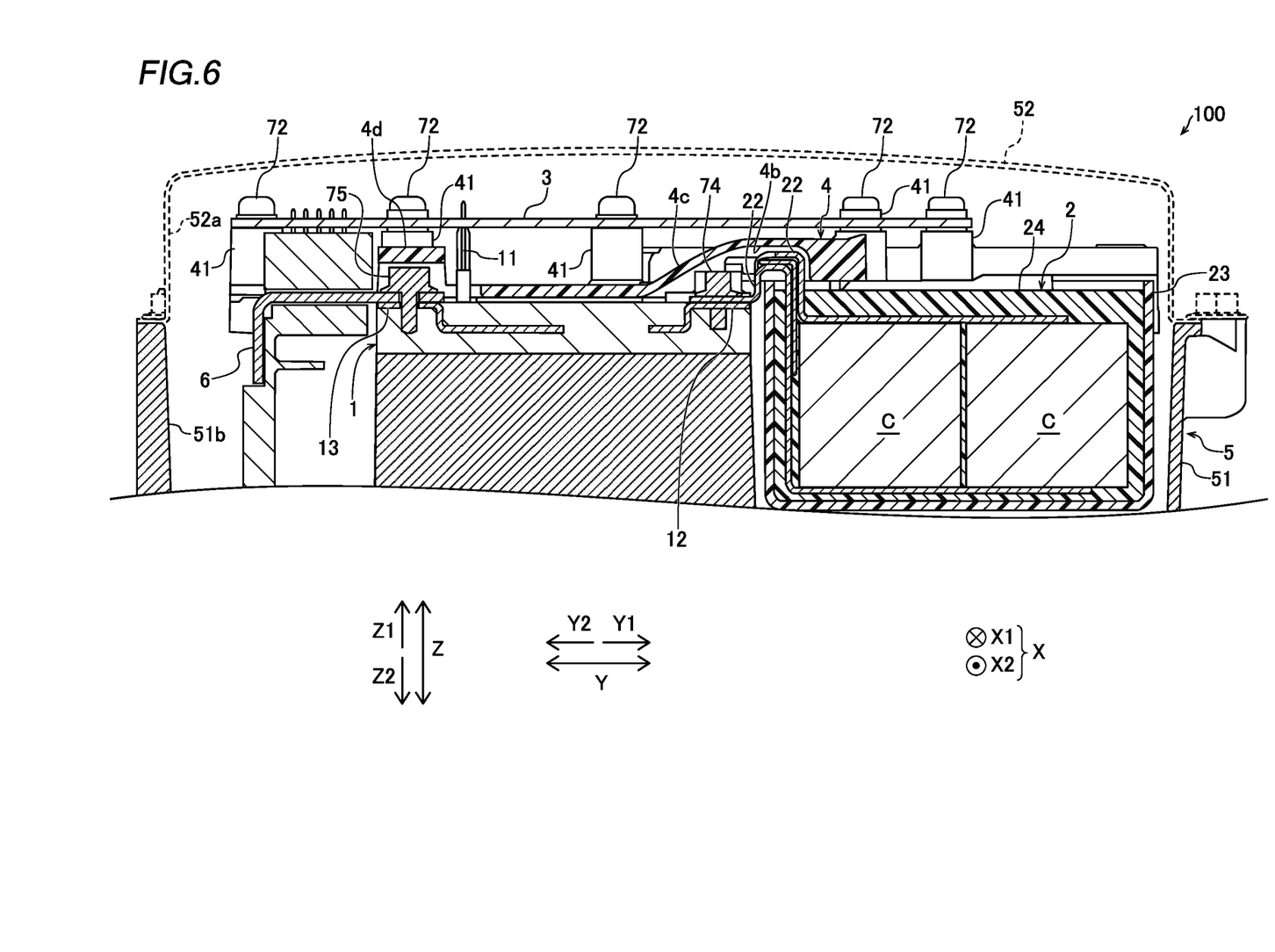
FIG. 6 is a partially sectional view taken along the line VI-VI in FIG. 3.

As shown in FIG. 6, the control board 3 is arranged above (Z1 direction side) the semiconductor module 1 and the capacitor module 2. The fixing plate 4 is located between the connection terminals 22 and the control board 3 so as to cover the connection terminals 22. The control board 3 is placed on the Z1 direction side of the bosses 41 of the fixing plate 4 and is fastened and fixed to the fixing plate 4 with the screws 72.

The capacitor module 2 includes the smoothing capacitors C, as shown in FIG. 6. The capacitor module 2 includes a capacitor case 23 that houses the smoothing capacitors. The capacitor case 23 is made of an insulating resin. The capacitor case 23 is a member made of a PPS resin similar to the fixing plate 4, for example.

The capacitor case 23 is filled with a resin 24 in a state that the smoothing capacitors C are housed therein. The resin 24 is an insulating resin. The resin 24 is an epoxy resin, for example.

Figure 7:
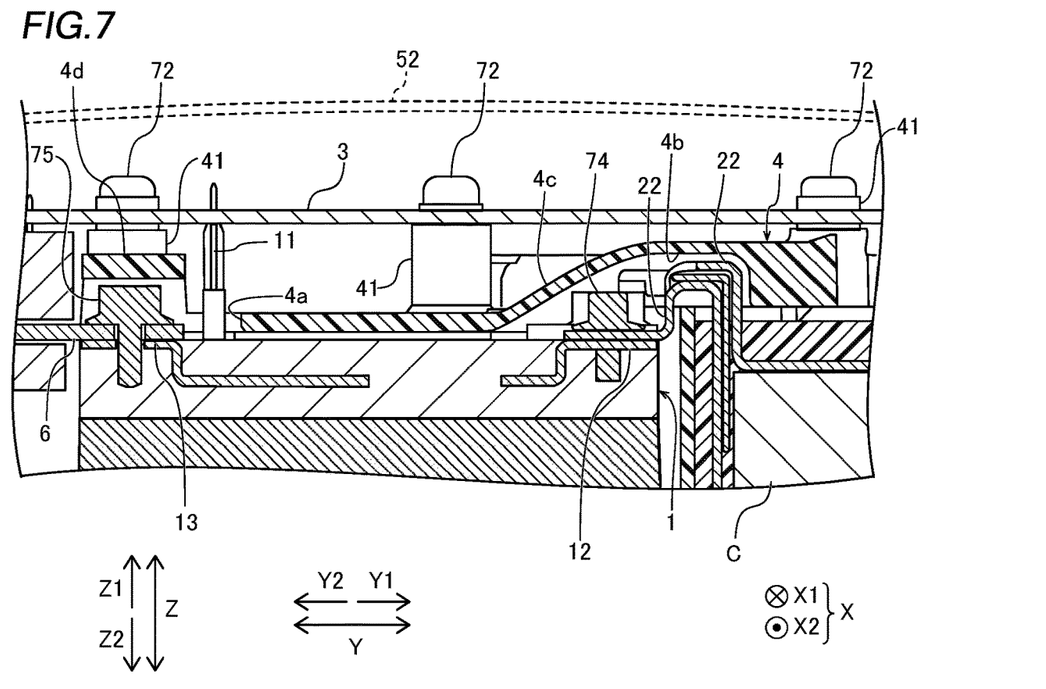
FIG. 7 is a partially enlarged view of the periphery of a semiconductor module in FIG. 6.

As shown in FIG. 7, the fixing plate 4 includes a recess 4b recessed in the Z1 direction so as to avoid interference with the connection terminals 22. The fixing plate 4 also includes an inclined portion 4c inclined from the Y2 direction side toward the recess 4b. The fixing plate 4 includes interference avoidance portions 4d on the Y2 direction side of the control terminals 11. The interference avoidance portions 4d are provided adjacent to the openings 4a. The interference avoidance portions 4d are described in detail below.

As shown in FIG. 7, the semiconductor module 1 includes input-side connectors 12 that connect the connection terminals 22 to the semiconductor module 1. The input-side connectors 12 are provided on the Z1 direction side and the capacitor module 2 side (Y1 direction side) of the semiconductor module 1. The semiconductor module 1 also includes output-side connectors 13 that connect the conductor wirings 6 to the semiconductor module 1. The output-side connectors 13 are provided on the Z1 direction side and the conductor wiring 6 side (Y2 direction side) of the semiconductor module 1.

As shown in FIG. 7, the connection terminals 22 of the capacitor module 2 are fastened and fixed to the input-side connectors 12 of the semiconductor module 1 with screws 74. The input-side connectors 12 are electrically connected to the switching elements in the semiconductor module 1. The input-side connectors 12 are terminals for inputting power supplied from the battery 300 via the connection terminals 22 to the semiconductor module 1.

As shown in FIG. 7, the conductor wirings 6 are fastened and fixed to the output-side connectors 13 of the semiconductor module 1 with screws 75. The output-side connectors 13 are electrically connected to the switching elements in the semiconductor module 1. The output-side connectors 13 are terminals for outputting power converted by the semiconductor module 1 via the conductor wirings 6.

Configuration of Capacitor Module

Figure 8:
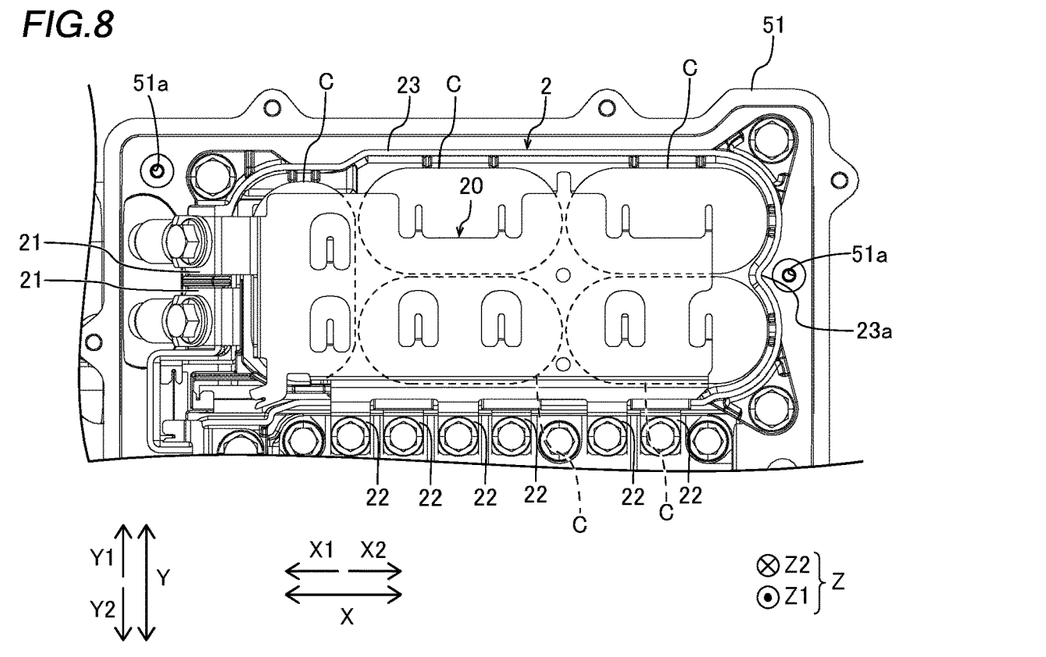
FIG. 8 is a diagram showing the internal configuration of a capacitor module.

As shown in FIG. 8, a plurality of (five) smoothing capacitors C is housed in the capacitor case 23. The capacitor case 23 includes a recess 23a recessed inward toward the smoothing capacitors C. Specifically, as viewed from the Z1 direction side, an outer edge of the recess 23a is recessed inward (X1 direction side) according to the shapes of the smoothing capacitors C each having a track shape.

As shown in FIG. 8, one of the plurality of fastening holes 51a is provided at a position corresponding to the recess 23a of the capacitor case 23. In this embodiment, one of the eight fastening holes 51a is provided at the position corresponding to the recess 23a. Specifically, one of the eight fastening holes 51a is provided inside the recess 23a so as to face the recess 23a.

Figure 9:
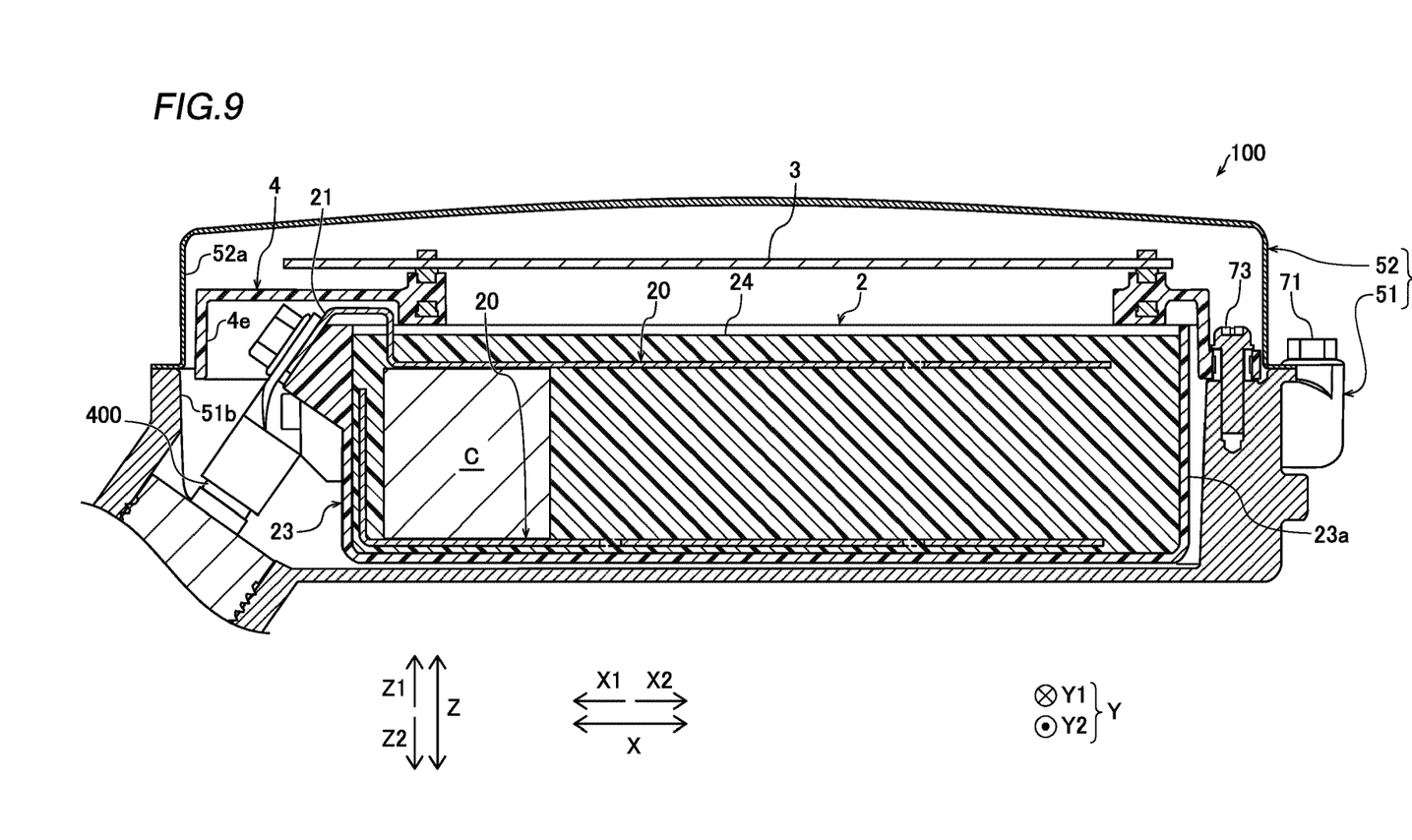
FIG. 9 is a partially sectional view taken along the line IX-IX in FIG. 2.

The connection terminals 21 and the connection terminals 22 of the capacitor module 2 are integrally formed by plate-shaped conductors 20 (see FIG. 8). The conductors 20 include copper, for example. One connection terminal 21 and three connection terminals 22 are provided on one conductor 20. As shown in FIG. 9, two conductors 20 are provided, and sandwich the smoothing capacitors C housed in the capacitor case 23 in the Z direction. The two conductors 20 are molded together with the smoothing capacitors C in the capacitor case 23 with the insulating resin 24.

Configurations of Side Walls of Housing and Wall of Fixing Plate

As shown in FIG. 9, the housing 5 includes side walls that surround the capacitor module 2. Specifically, the main body 51 includes a side wall 51b that surrounds the capacitor module 2. The cover 52 includes a side wall 52a that surrounds the capacitor module 2. The side walls 51b and 52a are examples of a "side wall" in the claims.

As shown in FIG. 9, the connection terminals 21 are provided at a position facing the side walls 51b and 52a. Specifically, the connection terminals 21 are provided on the X2 direction side of the side walls 51b and 52a so as to face the side walls 51b and 52a in the X direction along the control board 3.

As shown in FIG. 9, the fixing plate 4 is located between the connection terminals 21 and the control board 3 so as to cover the connection terminals 21. Moreover, the fixing plate 4 is located between the connection terminals 21 of the capacitor module 2 and the housing 5 so as to cover the connection terminals 21. Specifically, the fixing plate 4 includes a wall 4e that extends along the side wall 51b and side wall 52a between the side walls (side walls 51b and 52a) of the housing 5 and the connection terminals 21. The wall 4e extends in the 22 direction along the side wall 51b of the main body 51 and the side wall 52a of the cover 52.

Figure 10:
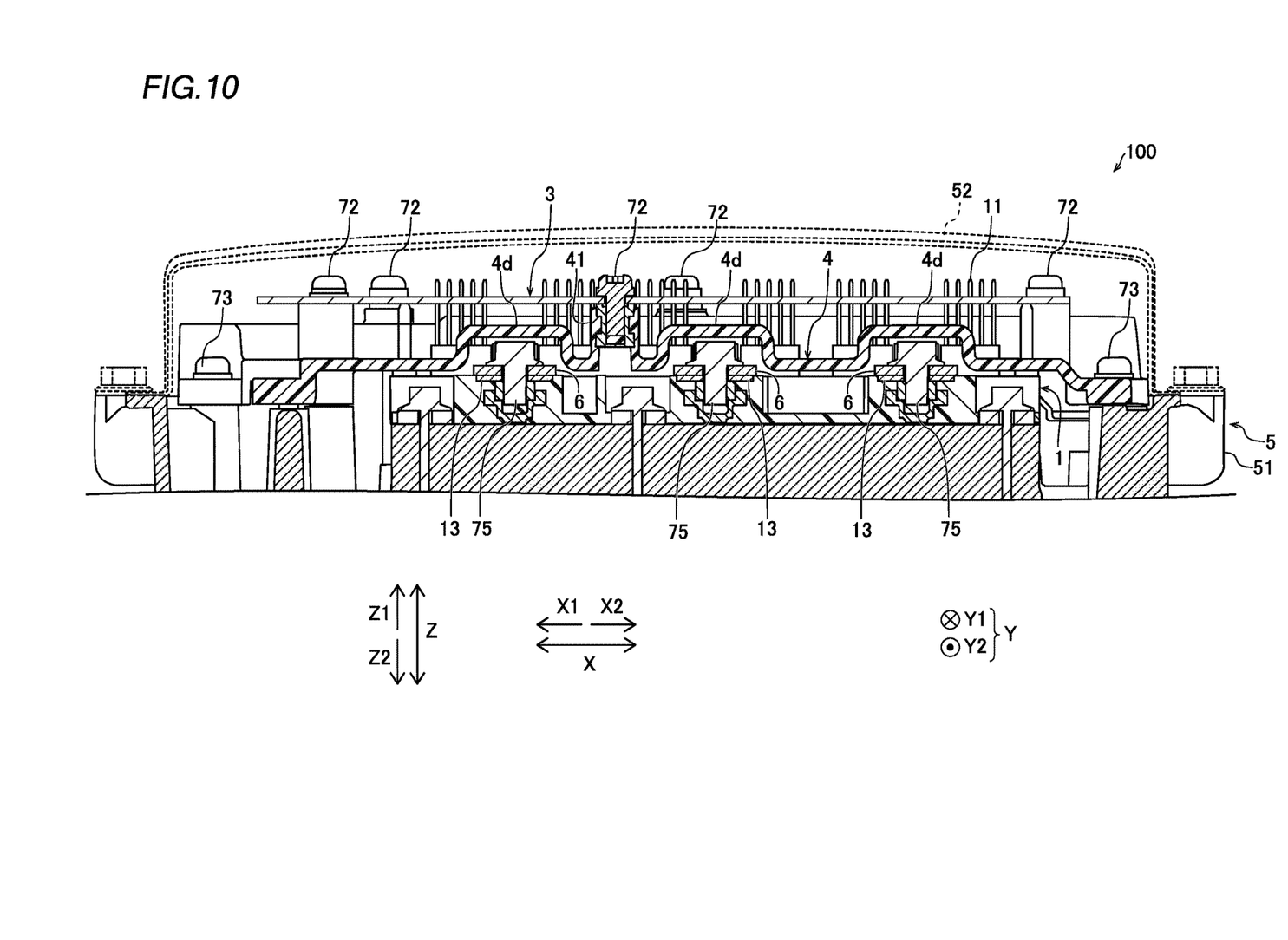
FIG. 10 is a partially sectional view taken along the line X-X in FIG. 3.

In this embodiment, as shown in FIGS. 9 and 10, the control board 3 is not directly fixed to the housing 5 but is fixed to the housing 5 via the fixing plate 4.

Configuration of Interference Avoidance Portions

The output-side connectors 13 of the semiconductor module 1 are provided so as to correspond to the plurality of conductor wirings 6. Specifically, as shown in FIG. 10, three output-side connectors 13 are provided so as to correspond to the three conductor wirings 6. That is, the semiconductor module 1 includes a plurality of (three) output-side connectors 13 provided so as to correspond to a plurality of (three) conductor wirings 6. As shown in FIG. 10, the fixing plate 4 is located between the plurality of output-side connectors 13 and the control board 3 so as to cover the plurality of output-side connectors 13. The plurality of output-side connectors 13 is an example of a "plurality of connectors" in the claims.

As shown in FIG. 10, the fixing plate 4 includes the concave interference avoidance portions 4d provided so as to correspond to the plurality of output-side connectors 13 and recessed to avoid interference with the plurality of output-side connectors 13. That is, three interference avoidance portions 4d are provided so as to correspond to the three output-side connectors 13. In this embodiment, the interference avoidance portions 4d are recessed in the Z1 direction to avoid the output-side connectors 13, the conductor wirings 6, and the screws 75.

As shown in FIG. 10, the control board 3 is fastened and fixed to the fixing plate 4 between the plurality of output-side connectors 13 in a direction along the control board 3. Specifically, the boss 41 is provided between the plurality of output-side connectors 13 and between the plurality of interference avoidance portions 4d in the X direction along the control board 3. The control board 3 is fastened and fixed to the fixing plate 4 using the screw 72 and the boss 41 of the fixing plate 4.

Advantageous Effects of this Embodiment

According to this embodiment, the following advantageous effects are achieved.

According to this embodiment, the plate-shaped fixing plate 4 made of an insulating resin is located between the capacitor module 2 and the control board 3 so as to cover the connection terminals 21 of the capacitor module 2. Accordingly, a distance between the connection terminals 21 of the capacitor module 2 and the control board 3 can be reduced as compared with a case in which the connection terminals 21 of the capacitor module 2 and the control board 3 are air-insulated (insulated by air) from each other. Consequently, an increase in the size of the housing 5 can be reduced or prevented, and thus an increase in the size of the power converter 100 due to an increase in the size of the housing 5 can be reduced or prevented. Furthermore, the plate-shaped fixing plate 4 made of an insulating resin is located between the capacitor module 2 and the control board 3 so as to cover the connection terminals 22 of the capacitor module 2. Accordingly, a distance between the connection terminals 22 of the capacitor module 2 and the control board 3 can be reduced as compared with a case in which the connection terminals 22 of the capacitor module 2 and the control board 3 are air-insulated from each other. Consequently, an increase in the size of the housing 5 can be reduced or prevented, and thus an increase in the size of the power converter 100 due to an increase in the size of the housing 5 can be reduced or prevented.

According to this embodiment, as described above, the control board 3 is arranged above (Z1 direction side) the semiconductor module 1 and the capacitor module 2, and the fixing plate 4 is located between the connection terminals 21 and 22 and the control board 3 so as to cover the connection terminals 21 and 22. Accordingly, the fixing plate 4 is located between the connection terminals 21 and 22 and the control board 3 so as to cover the connection terminals 21 and 22, and thus a distance between the connection terminals 21 and 22 and the control board 3 can be reduced as compared with a case in which the connection terminals 21 and 22 and the control board 3 are air-insulated from each other. Consequently, an increase in the size of the housing 5 can be reduced or prevented, and thus an increase in the size of the power converter 100 due to an increase in the size of the housing 5 can be reduced or prevented.

According to this embodiment, as described above, the control board 3 is fixed to the housing 5 via the fixing plate 4 without being directly fixed to the housing 5. When the control board 3 is fixed to both the housing 5 and the fixing plate 4, it becomes difficult to fix the control board 3 due to the dimensional tolerance of each of the housing 5 and the fixing plate 4. On the other hand, in this embodiment, the control board 3 is fixed to the housing 5 via the fixing plate 4, and thus it is only required to fix the control board 3 according to the dimensional tolerance of the fixing plate 4. Consequently, the control board 3 can be easily fixed to the fixing plate 4.

According to this embodiment, as described above, the housing 5 (the main body 51 and the cover 52) is made of metal. The fixing plate 4 is located between the connection terminals 21 of the capacitor module 2 and the housing 5 so as to cover the connection terminals 21. Accordingly, the fixing plate 4 is located between the connection terminals 21 of the capacitor module 2 and the housing 5 so as to cover the connection terminals 21, and thus even when the housing 5 is deformed to be dented inward due to an external impact or the like, contact of the housing 5 made of metal with the connection terminals 21 of the capacitor module 2 can be prevented. Consequently, when the housing 5 made of metal is deformed to be dented inward due to an external impact or the like, a short circuit between the connection terminals 21 of the capacitor module 2 and the deformed housing 5 can be prevented.

According to this embodiment, as described above, the housing 5 (the main body 51 and the cover 52) includes the side walls (side walls 51b and 52a) surrounding the capacitor module 2. The connection terminals 21 are provided at the position facing the side walls (side walls 51b and 52a), and the fixing plate 4 includes the wall 4e extending along the side walls (side walls 51b and 52a) between the side walls (side walls 51b and 52a) of the housing 5 (the main body 51 and the cover 52) and the connection terminals 21. Accordingly, the wall 4e extends along the side walls (side walls 51b and 52a) of the housing 5 (the main body 51 and the cover 52) between the side walls (side walls 51b and 52a) of the housing 5 (the main body 51 and the cover 52) and the connection terminals 21, and thus even when the housing 5 is deformed to be dented inward due to an external impact or the like, contact of the housing 5 made of metal with the connection terminals 21 of the capacitor module 2 can be prevented. Consequently, when the housing 5 made of metal is deformed to be dented inward due to an external impact or the like, a short circuit between the connection terminals 21 of the capacitor module 2 and the deformed housing 5 can be easily prevented.

According to this embodiment, as described above, the housing 5 includes the plurality of fastening holes 51a to fasten and fix the fixing plate 4. The capacitor module 2 includes the capacitor case 23 to house the smoothing capacitors C, and the capacitor case 23 includes the recess 23a recessed inward (X1 direction side) toward the smoothing capacitors C. One of the plurality of fastening holes 51a is provided at the position corresponding to the recess 23a of the capacitor case 23. Accordingly, one of the plurality of fastening holes 51a is provided at the position corresponding to the recess 23a recessed inward toward the smoothing capacitors C, and thus a space provided by the recess 23a can be effectively used to provide the fastening hole 51a. Consequently, an increase in the size of the housing 5 in a direction (X direction) in which the recess 23a of the capacitor case 23 is recessed can be reduced or prevented, and thus an increase in the size of the power converter 100 due to an increase in the size of the housing 5 can be reduced or prevented.

According to this embodiment, as described above, the semiconductor module 1 includes the control terminals 11 connected to the control board 3. The fixing plate 4 includes the openings 4a extending along the control board 3 and provided so as to correspond to the control terminals 11. The control terminals 11 are connected to the control board 3 via the openings 4a. Accordingly, as compared with a case in which wiring is provided to connect the control terminals 11 of the semiconductor module 1 to the control board 3 so as to bypass the fixing plate 4 arranged between the semiconductor module 1 and the control board 3, connection paths can be further shortened. Consequently, the control terminals 11 of the semiconductor module 1 can be easily connected to the control board 3, and thus the complexity of the device configuration can be reduced or prevented.

According to this embodiment, as described above, the power converter 100 includes the plurality of conductor wirings 6 electrically connected to the motor 200 outside the power converter. The semiconductor module 1 includes the plurality of output-side connectors 13 provided so as to correspond to the plurality of conductor wirings 6 to connect the plurality of conductor wirings 6 to the semiconductor module 1. The fixing plate 4 is located between the plurality of output-side connectors 13 and the control board 3 so as to cover the plurality of output-side connectors 13. Accordingly, the fixing plate 4 is located between the plurality of output-side connectors 13 and the control board 3 so as to cover the plurality of output-side connectors 13, and thus a distance between the plurality of output-side connectors 13 and the control board 3 can be reduced as compared with a case in which the plurality of output-side connectors 13 and the control board 3 are air-insulated from each other. Consequently, an increase in the size of the housing 5 can be reduced or prevented, and thus an increase in the size of the power converter 100 due to an increase in the size of the housing 5 can be reduced or prevented.

According to this embodiment, as described above, the control board 3 is fastened and fixed to the fixing plate 4 between the plurality of output-side connectors 13 in the X direction along the control board 3. Accordingly, unlike a case in which the control board 3 is fastened and fixed to the fixing plate 4 at a position overlapping one of the plurality of output-side connectors 13, interference of the screw 72 for fastening and fixing the control board 3 with the output-side connector 13 can be reduced or prevented. Consequently, as compared with a case in which the control board 3 is fastened and fixed to the fixing plate 4 at the position overlapping one of the plurality of output-side connectors 13, a portion (boss 41) at which the control board 3 is fastened can be positioned closer to the semiconductor module 1. Thus, the size of the fixing plate 4 in the Z direction in which the fixing plate 4 faces the semiconductor module 1 can be reduced, and thus an increase in the size of the housing 5 can be reduced or prevented. Consequently, an increase in the overall size of the power converter 100 due to an increase in the size of the housing 5 can be reduced or prevented.

According to this embodiment, as described above, the fixing plate 4 includes the concave interference avoidance portions 4d provided so as to correspond to the plurality of output-side connectors 13 and recessed to avoid interference with the plurality of output-side connectors 13. Accordingly, interference of the fixing plate 4 with the plurality of output-side connectors 13 can be avoided by the concave interference avoidance portions 4d, and thus the fixing plate 4 can be positioned closer to the semiconductor module 1 including the plurality of output-side connectors 13. Consequently, the size of the housing 5 in the Z direction in which the semiconductor module 1 and the fixing plate 4 face each other can be further reduced. Thus, an increase in the size of the housing 5 can be further reduced or prevented, and thus an increase in the size of the power converter 100 due to an increase in the size of the housing 5 can be further reduced or prevented.

Modified Examples

The embodiment disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

For example, while the fixing plate 4 (insulating plate) is located between the connection terminals 21 (first connection terminal) and 22 (second connection terminal) and the control board 3 so as to cover the connection terminals 21 and the connection terminals 22 in the aforementioned embodiment, the present invention is not limited to this. For example, the insulating plate may alternatively cover only one of the first connection terminal and the second connection terminal.

While the control board 3 is arranged above (Z1 direction side) the semiconductor module 1 and the capacitor module 2 in the aforementioned embodiment, the present invention is not limited to this. In the present invention, the control board may alternatively be arranged below at least one of the semiconductor module and the capacitor module.

While the control board 3 is not directly fixed to the housing 5 but is fixed to the housing 5 via the fixing plate 4 (insulating plate) in the aforementioned embodiment, the present invention is not limited to this. In the present invention, the control board may alternatively be fixed to both the housing and the insulating plate.

While the housing 5 (the main body 51 and the cover 52) is made of metal and has electrical conductivity in the aforementioned embodiment, the present invention is not limited to this. In the present invention, the housing may alternatively be made of a material other than metal, such as ceramic or resin. Furthermore, the housing may alternatively be made of a non-conductive material.

While the fixing plate 4 (insulating plate) is located between the connection terminals 21 (first connection terminal) of the capacitor module 2 and the housing 5 so as to cover the connection terminals 21 in the aforementioned embodiment, the present invention is not limited to this. In the present invention, the insulating plate may not be provided between the first connection terminal of the capacitor module and the housing.

While the capacitor case 23 includes the recess 23a recessed inward toward the smoothing capacitors C in the aforementioned embodiment, the present invention is not limited to this. In the present invention, the capacitor case may alternatively have a rectangular shape without the recess.

While one of the plurality of fastening holes 51a is provided at the position corresponding to the recess 23a of the capacitor case 23 in the aforementioned embodiment, the present invention is not limited to this. In the present invention, all of the plurality of fastening holes may alternatively be provided at positions other than the position corresponding to the recess of the capacitor case. Furthermore, two or more of the fastening holes may alternatively be provided at the position corresponding to the recess of the capacitor case.

While the control terminals 11 of the semiconductor module 1 are connected to the control board 3 via the openings 4a of the fixing plate 4 (insulating plate) in the aforementioned embodiment, the present invention is not limited to this. In the present invention, wiring may alternatively be provided to connect the control terminals of the semiconductor module to the control board so as to bypass the insulating plate without providing the openings in the insulating plate.

While the fixing plate 4 (insulating plate) is located between the plurality of output-side connectors 13 (the plurality of connectors) and the control board 3 so as to cover the plurality of output-side connectors 13 in the aforementioned embodiment, the present invention is not limited to this. In the present invention, the insulating plate may alternatively cover only the first connection terminal and the second connection terminal without covering the plurality of connectors.

While the control board 3 is fastened and fixed to the fixing plate 4 (insulating plate) between the plurality of output-side connectors 13 (the plurality of connectors) in the X direction along the control board 3 in the aforementioned embodiment, the present invention is not limited to this. In the present invention, the control board may alternatively be fastened and fixed to the insulating plate at a position overlapping one of the plurality of connectors.

While the fixing plate 4 (insulating plate) includes the concave interference avoidance portions 4d provided so as to correspond to the plurality of output-side connectors 13 (the plurality of connectors) and recessed to avoid interference with the plurality of output-side connectors 13 in the aforementioned embodiment, the present invention is not limited to this. In the present invention, the interference avoidance portion may alternatively be provided in common for the plurality of connectors.

What is claimed is:

1. A power converter comprising:
a semiconductor module to perform power conversion;
a capacitor module including a smoothing capacitor, a first connection terminal configured to electrically connect the smoothing capacitor to a power supply outside the power converter, and a second connection terminal electrically connected to the semiconductor module;
a control board to control the power conversion of the semiconductor module;
a plate-shaped insulating plate located between the capacitor module and the control board so as to cover at least one of the first connection terminal and the second connection terminal and made of an insulating resin, and
a housing to house the semiconductor module, the capacitor module, the control board, and the insulating plate so that the semiconductor module, the capacitor module, the control board and the insulating plate are not exposed to outside.

2. The power converter according to claim 1, wherein
the control board is arranged above the semiconductor module and the capacitor module; and
the insulating plate is located between the first and second connection terminals and the control board so as to cover the first and second connection terminals.

3. The power converter according to claim 1, wherein the control board is fixed to the housing via the insulating plate without being directly fixed to the housing.

4. The power converter according to claim 1, wherein
the housing is made of metal; and
the insulating plate is located between the first connection terminal of the capacitor module and the housing so as to cover the first connection terminal.

5. The power converter according to claim 4, wherein
the housing includes a side wall surrounding the capacitor module;
the first connection terminal is provided at a position facing the side wall; and
the insulating plate includes a wall extending along the side wall between the side wall of the housing and the first connection terminal.

6. The power converter according to claim 1, wherein
the housing includes a plurality of fastening holes to fasten and fix the insulating plate;
the capacitor module further includes a capacitor case to house the smoothing capacitor;
the capacitor case includes a recess recessed inward toward the smoothing capacitor; and
at least one of the plurality of fastening holes is provided at a position corresponding to the recess of the capacitor case.

7. The power converter according to claim 1, wherein
the semiconductor module includes a control terminal connected to the control board;
the insulating plate includes an opening extending along the control board and provided so as to correspond to the control terminal; and
the control terminal is connected to the control board via the opening.

8. The power converter according to claim 1, further comprising:
a plurality of conductor wirings configured to be electrically connected to a load outside the power converter; wherein
the semiconductor module includes a plurality of connectors provided so as to correspond to the plurality of conductor wirings to connect the plurality of conductor wirings to the semiconductor module; and
the insulating plate is located between the plurality of connectors and the control board so as to cover the plurality of connectors.

9. The power converter according to claim 8, wherein the control board is fastened and fixed to the insulating plate between the plurality of connectors in a direction along the control board.

10. The power converter according to claim 8, wherein the insulating plate includes a concave interference avoidance portion provided so as to correspond to each of the plurality of connectors and recessed to avoid interference with the plurality of connectors.

11. A power converter comprising:
a semiconductor module to perform power conversion;
a capacitor module including a smoothing capacitor, a first connection terminal configured to electrically connect the smoothing capacitor to a power supply outside the power converter, and a second connection terminal electrically connected to the semiconductor module;
a control board to control the power conversion of the semiconductor module;
a housing to house the semiconductor module, the capacitor module, and the control board; and
a plate-shaped insulating plate located between the capacitor module and the control board so as to cover at least one of the first connection terminal and the second connection terminal and made of an insulating resin,
wherein the housing is made of metal; and
the insulating plate is located between the first connection terminal of the capacitor module and the housing so as to cover the first connection terminal.

* * * * *